(12) United States Patent
Chen et al.

(10) Patent No.: US 10,342,336 B2
(45) Date of Patent: Jul. 9, 2019

(54) BRACKET DEVICE

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 71 days.

(21) Appl. No.: 15/399,753

(22) Filed: Jan. 6, 2017

(65) Prior Publication Data
US 2018/0014640 A1 Jan. 18, 2018

(30) Foreign Application Priority Data
Jul. 13, 2016 (TW) .............................. 105122158 A (51) Int. Cl.
*A47B 57/34* (2006.01)
*A47B 57/54* (2006.01)
*A47B 57/36* (2006.01)
*H05K 7/14* (2006.01)

(52) U.S. Cl.
CPC ............ *A47B 57/545* (2013.01); *A47B 57/34* (2013.01); *A47B 57/36* (2013.01); *H05K 7/1489* (2013.01)

(58) Field of Classification Search
CPC ....... A47B 88/43; A47B 96/07; A47B 96/068; A47B 57/545; A47B 88/423; H05K 7/1489
See application file for complete search history.

(56) References Cited

U.S. PATENT DOCUMENTS

| | | | |
|---|---|---|---|
| 7,357,362 B2 * | 4/2008 | Yang | H05K 7/1489 248/220.22 |
| 7,552,899 B2 | 6/2009 | Chen | |
| 7,694,926 B2 | 4/2010 | Allen | |

(Continued)

FOREIGN PATENT DOCUMENTS

| | | |
|---|---|---|
| DE | 20 2007 018 054 U1 | 3/2008 |
| EP | 3 005 901 A1 | 4/2016 |

(Continued)

*Primary Examiner* — Bradley Duckworth
(74) *Attorney, Agent, or Firm* — Winston Hsu (57) ABSTRACT

A bracket device includes a bracket, a mounting member and a locking member. The bracket includes a first end part and a second end part. A space is defined between the first end part and the second end part. The mounting member is arranged adjacent to the first end part of the bracket. The mounting member has a mounting part located in the space. The locking member is arranged on the bracket and includes a locking part and an operating part. Wherein, the locking part of the locking member is held to be located at a position in the space of the bracket. The locking part of the locking member is able to be moved away from the position in response to operation of the operating part of the locking member. Wherein, the operating part of the locking member is not located in the space of the bracket.

20 Claims, 6 Drawing Sheets

(56) References Cited

U.S. PATENT DOCUMENTS

| | | | |
|---|---|---|---|
| 7,699,279 B2* | 4/2010 | Chen | A47B 88/43 |
| | | | 248/220.22 |
| 7,731,142 B2 | 6/2010 | Chen | |
| 7,798,581 B2* | 9/2010 | Chen | H05K 7/1489 |
| | | | 211/26 |
| 7,878,468 B2* | 2/2011 | Chen | A47B 88/43 |
| | | | 211/26 |
| 8,328,300 B2 | 12/2012 | Yu | |
| 8,371,454 B2* | 2/2013 | Chen | H05K 7/1421 |
| | | | 211/26 |
| 8,403,432 B2* | 3/2013 | Chen | A47B 88/43 |
| | | | 312/333 |
| 8,596,471 B2* | 12/2013 | Chen | H05K 7/1421 |
| | | | 211/153 |
| 8,672,431 B2* | 3/2014 | Chen | F24C 15/168 |
| | | | 312/333 |
| 8,967,565 B2* | 3/2015 | Chen | A47B 88/044 |
| | | | 211/192 |
| 9,237,808 B2* | 1/2016 | Chen | A47B 96/07 |
| 9,370,120 B2* | 6/2016 | Chen | A47B 96/025 |
| 9,526,338 B2* | 12/2016 | Chen | A47B 47/0058 |
| 9,532,483 B1* | 12/2016 | Chang | F16B 2/12 |
| 9,629,460 B1* | 4/2017 | Chen | H05K 7/1489 |
| 9,681,573 B2* | 6/2017 | Chen | H05K 7/1489 |
| 9,801,467 B2* | 10/2017 | Chen | H05K 7/1489 |
| 2008/0078899 A1* | 4/2008 | Chen | A47B 88/43 |
| | | | 248/220.21 |
| 2008/0087781 A1 | 4/2008 | Chen | |
| 2009/0294393 A1* | 12/2009 | Chen | H05K 7/1489 |
| | | | 211/175 |
| 2014/0363108 A1 | 12/2014 | Chen | |
| 2014/0363109 A1 | 12/2014 | Chen | |
| 2015/0069196 A1 | 3/2015 | Chen | |
| 2016/0324317 A1* | 11/2016 | Chen | H05K 7/1489 |
| 2017/0013959 A1* | 1/2017 | Chen | A47B 96/07 |
| 2017/0055707 A1* | 3/2017 | Chen | A47B 88/407 |
| 2017/0079427 A1* | 3/2017 | Chen | H05K 7/1489 |
| 2017/0196354 A1* | 7/2017 | Chen | A47B 57/38 |
| 2017/0224110 A1* | 8/2017 | Chen | A47B 88/044 |
| 2017/0290424 A1* | 10/2017 | Chen | A47B 88/044 |
| 2018/0070724 A1* | 3/2018 | Chen | A47B 96/06 |
| 2018/0084908 A1* | 3/2018 | Chen | A47B 57/44 |
| 2018/0098626 A1* | 4/2018 | Chen | A47B 88/43 |
| 2018/0116398 A1* | 5/2018 | Chen | H05K 7/1489 |

FOREIGN PATENT DOCUMENTS

| | | |
|---|---|---|
| JP | 3127644 U | 12/2006 |
| JP | 3179651 U | 11/2012 |

* cited by examiner

BRACKET DEVICE

BACKGROUND OF THE INVENTION

1. Field of the Invention

The present invention relates to a bracket device, and more particularly, to a bracket device configured to mount a slide rail to a rack.

2. Description of the Prior Art

U.S. Pat. No. 7,552,899 B2 discloses a slide bracket having a plurality of suspension block (2) configured to be inserted into a plurality of holes (51) of a support (5) from front to rear of the support (5), and the support (5) can be locked by a retaining member (3). As such, the slide bracket can be mounted to the support (5). Wherein, a user can hold a releasing member (4) to pass through the holes (51) from front of the support (5), so as to allow the releasing member (4) to extend to rear of the support (5) in order to operatively move the retaining member (3) to be in a unlocking status. Therefore, the slide bracket is able to be detached from the support (5).

U.S. Pat. No. 7,694,926 B2 discloses a mounting bracket. As shown in FIG. 4A to FIG. 4C of the case, the mounting bracket (200, 202) comprises a side plate (204) and an end plate (210). The end plate (210) has a pin (210). During installation, a user can apply a force along a direction from front to rear of a support column (104), in order to insert the pin (210) into a hole (106) of the support column (104). When an end of the support column (104) extends past the edge of a flat spring (214), the flat spring (214) returns to an unbiased position to abut the support column (104). Moreover, as show in FIG. 4D and FIG. 4E of the case, a hand-operated end (226) can be operated in rear of the support column (104), in order to drive an operational portion (228) bias the flat spring (214) toward the side plate (204), such that the mounting bracket (200, 202) can be detached from the support column (104).

U.S. Pat. No. 8,328,300 B2 discloses a mounting apparatus for slide rail. The mounting apparatus comprises a mounting bracket (10) and a clipping member (30). The mounting bracket (10) is mounted to a slide rail (100), and has an elongated sliding portion (12) and an end plate (14). The end plate (14) is arranged with two inserting pins (142) toward rear of the mounting bracket (10). Wherein, the clipping member (30) has a stopping segment (33) configured to lock a post (80). The clipping member (30) has a touch portion (315) or an operating portion configured to operate the stopping segment (33) to move, and the touch portion (315) or the operating portion is in rear of the post (80).

US patent publication number US 2015/0069196 A1 discloses a mounting bracket for slide assembly. The mounting bracket comprises a mounting bracket (34) and a stop (46). Wherein, the mounting bracket (34) comprises a side wall (42) and an end wall (44). The end wall (44) is arranged with two installation members (50) toward rear of the bracket (34). Wherein, the stop (46) has an end portion (84) configured to lock or block a post (22). Wherein, the end portion (84) can be released to unlock the post (22) in response to operation of a middle portion (74) or an operating portion of the stop (46). The middle portion (74) or the operating portion of the stop (46) is in rear of the post (22)

According to the above illustration, the bracket disclosed in each of the cases has a mounting member, such as a suspension block or pin, configured to be inserted into a hole of a post along a direction from front to rear of the post, and a locking member (or a blocking member) on the bracket can lock (or abut) the post. However, it becomes a common design to arrange the locking member (or the blocking member) for locking the post and an operating portion for unlocking the post to be in rear of the post. Thereby, when in a limited space, it is difficult to unlock the post from such type of bracket in rear of the post. Therefore, it is important to provide a bracket allowing a user to directly unlock the post from the bracket in front of the post without using tools.

SUMMARY OF THE INVENTION

The present invention relates to a bracket device comprising an operating part for conveniently operating a locking member.

According to an embodiment of the present invention, a bracket device comprises a bracket comprising a first end part and a second end part, a space being defined between the first end part and the second end part; a mounting member arranged adjacent to the first end part of the bracket, the mounting member having a mounting part located in the space of the bracket; and a locking member arranged on the bracket, and comprising a locking part and an operating part, wherein the locking part of the locking member is held to be located at a locking position in the space of the bracket, the locking part of the locking member is able to be moved away from the locking position in response to operation of the operating part of locking member; wherein the operating part of the locking member is not located in the space of the bracket.

According to another embodiment of the present invention, a bracket device for a slide rail comprises a bracket, a base, a mounting member and a locking member. The base is attached to the bracket. The base comprises a rear part and a front part. The mounting member is adjacent to the rear part of the base. The locking member comprises an operating part configured to be operated to move the locking member from a first position to a second position. Wherein, a portion of the operating part is located adjacent to the base and between the rear part and the front part of the base. The locking member is configured to lock the bracket device to the post when the locking member is located at the first position.

According to yet another embodiment of the present invention, a bracket device configured to mount a slide rail to a post is disclosed. The post has a hole. The bracket device comprises a bracket, a base, a mounting member and a locking member. The base is attached to the bracket. The base comprises a rear part and a front part. The mounting member is adjacent to the rear part of the base. The mounting member is configured to penetrate through the hole of the post to be in rear of the post. The locking member comprises an operating member and a stopping part. The operating member is configured to be operated to move the locking member relative to the bracket from a first position to a second position. Wherein, the stopping part of the locking member faces toward the post when the locking member is located at the first position; and the stopping part of the locking member does not face toward the post when the locking member is located at the second position. Wherein, a front end of the operating part is away from the rear part of the base to be in front of the post.

Preferably, the bracket comprises a side plate and an end plate bent relative to the side plate, the mounting member penetrates through the end plate.

Preferably, the locking member and the operating part are integrally formed in one piece.

Preferably, the locking member and the operating part are not integrally formed in one piece.

Preferably, the bracket device further comprises an elastic member, the locking member is held at the first position in response to an elastic force provided by the elastic member.

Preferably, the bracket comprises an engaging feature, the locking member further comprises a locking part, when the locking member is located at the locking position, the locking part is configured to abut against the engaging feature.

Preferably, one of the engaging feature and the locking part is a hook.

Preferably, the locking member is movably mounted to the side plate of the bracket, a stopping part of the locking member faces toward the endplate of the bracket when the locking member is located at the first position; and the stopping part of the locking member does not face toward the end plate of the bracket when the locking member is away from the first position.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
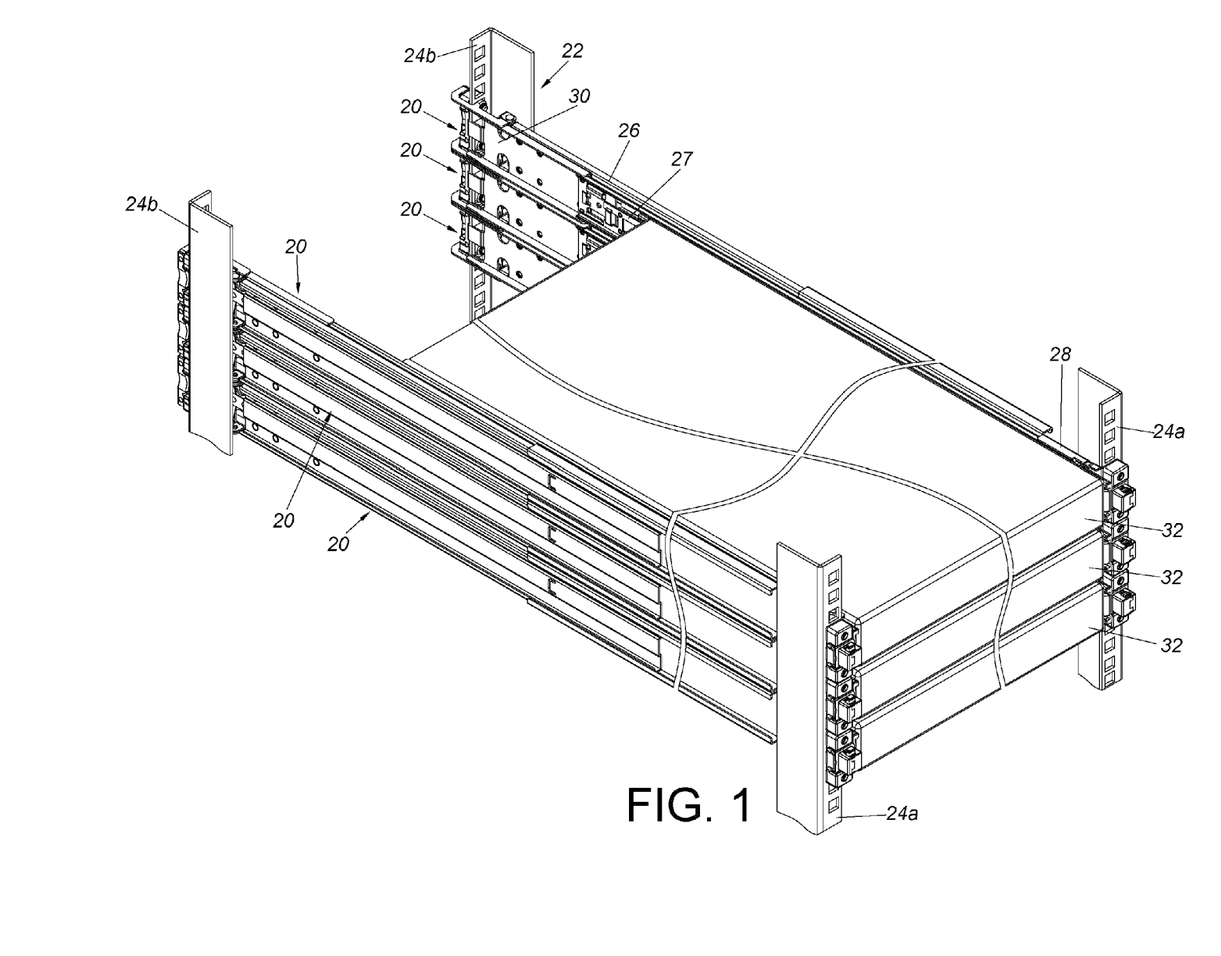
FIG. 1 is a diagram showing by three pairs of slide rail assemblies mounted to a rack for carrying three chassis respectively according to an embodiment of the present invention.

FIG. 1 is a diagram showing three pairs of slide rail assemblies 20 being mounted to a rack 22. Specifically, the rack 22 comprises a pair of first posts 24a and a pair of second posts 24b. Each of the slide rail assemblies 20 comprises a first rail 26 and a second rail 27 movable relative to the first rail 26. Wherein, two portions of the first rail 26 are mounted to the first post 24a and the second post 24b through a first bracket device 28 and a second bracket device 30 respectively. A carried object 32 can be mounted to the second rail 27. The carried object 32 can be a chassis of an electronic apparatus or a drawer. The carried object 32 can be located inside the rack 22 (such as in a status shown in FIG. 1), or the carried object 32 can be pulled out of the rack 22 by moving the second rail 27 relative to the first rail 26.

Figure 2:
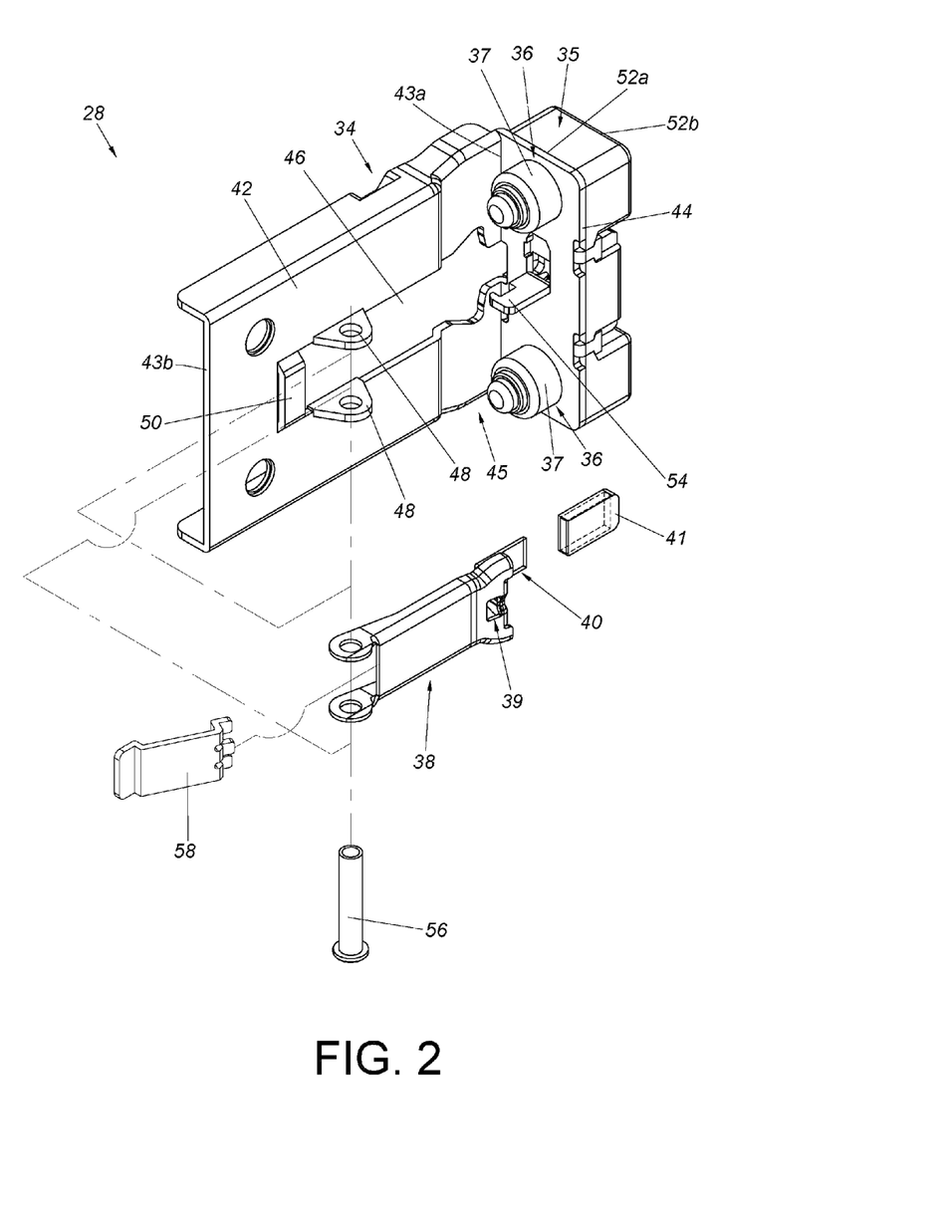
FIG. 2 is an exploded view of a bracket device according to an embodiment of the present invention.
Figure 3:
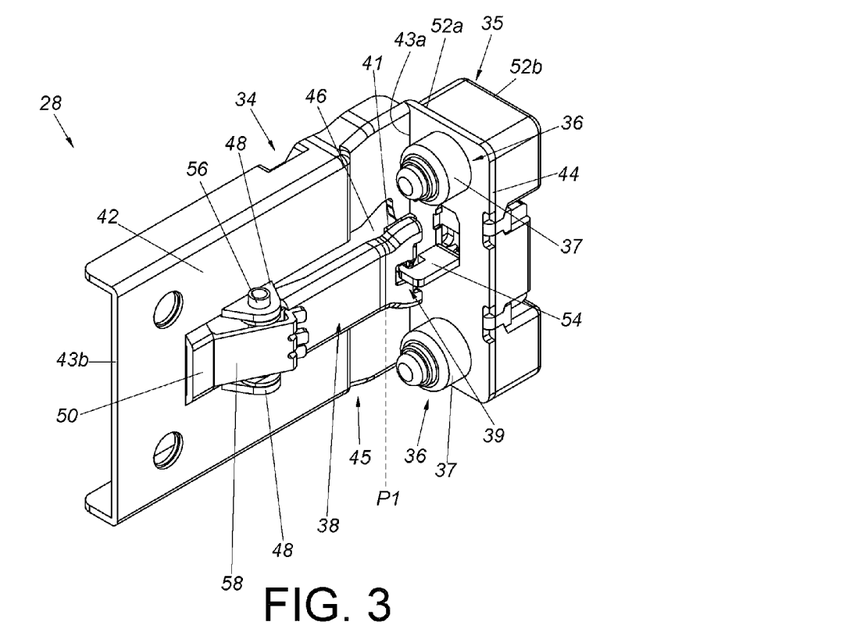
FIG. 3 is a diagram showing the bracket device of FIG. 2 in a first viewing angle.

As shown in FIG. 2 and FIG. 3, the first bracket device 28 (hereinafter referred to as bracket device 28) comprises a bracket 34, at least one mounting member 36 and a locking member 38.

The bracket 34 comprises a side plate 42. Preferably, the bracket 34 further comprises an end plate 44 bent relative to the side plate 42. In the present embodiment, the side plate 42 is substantially perpendicularly connected to the end plate 44. The bracket 34 comprises a first end part 43a and a second end part 43b opposite to the first end part 43a. A space 45 is defined between the first end part 43a and the second end part 43b. In addition, the side plate 42 is formed with an opening 46, at least one ear part 48 adjacent to the opening 46 and a connecting part 50. In the present embodiment, the side plate 42 is formed with two ear parts 48. The two ear parts 48 are located at two sides of the opening 46. Each of the ear parts 48 is bent relative to the side plate 42. In the present embodiment, the ear part 48 is substantially perpendicularly connected to the side plate 42.

The mounting member 36 is arranged adjacent to the first end part 43a of the bracket 34. The mounting member 36 comprises amounted part 37 located in the space 45 of the bracket 34. Preferably, the bracket device 28 further comprises a base 35 attached to the bracket 34. For example, the base 35 can be attached to the end plate 44 of the bracket 34. The mounting member 36 is adjacent to a rear part 52a of the base 35. Preferably, the mounting member 36 penetrates through the end plate 44, and the end plate 44 is located at a side of the rear part 52a of the base 35. In the present embodiment, the bracket device 28 comprises two mounting members 36, and the two mounting members 36 are spaced from each other. Preferably, the bracket 34 further comprises an engaging feature 54. In the present embodiment, the engaging feature 54 can be a hook, and the engaging feature 54 is located between the two mounting members 36. Moreover, the base 35 is not limited to the arrangement shown in FIG. 2 and FIG. 3. In other embodiments of the present invention, the base 35 can be in a plate shape or other shape.

The locking member 38 is arranged on the bracket 34. Specifically, the locking member 38 comprises a locking part 39 and an operating part 40. Wherein, the locking part 39 of the locking member 38 is held at a locking position P1 in the space 45 of the bracket 34. The locking part 39 of the locking member 38 is able to be moved away from the locking position P1 in response to operation of the operating part 40 of the locking member 38. The locking member 38 is movably mounted to the side plate 42 of the bracket 34. For example, the locking member 38 is pivoted to the two ear parts 48 by an pivotal member 56. Preferably, the bracket device 28 further comprises an elastic member 58. The elastic member 58 is arranged between the connecting part 50 and the locking member 38. The elastic member 58 can be an elastic piece or a spring. The locking member 38 is held at a first position P1 (such as the locking position P1) in response to an elastic force provided by the elastic member 58. Preferably, the locking part 39 of the locking member 38 is formed with a hole or a slot corresponding to the engaging feature 54 of the bracket 34. On the other hand, in other embodiments of the present invention, the engaging feature 54 can be formed with a hole or a slot, and the locking part 39 can be a hook corresponding to the engaging feature 54, but the present invention is not limited thereto. When the locking member 38 is located at the first position P1, the locking part 39 of the locking member 38 is configured to abut against or engage with the engaging feature 54 of the bracket 34.

Figure 4:
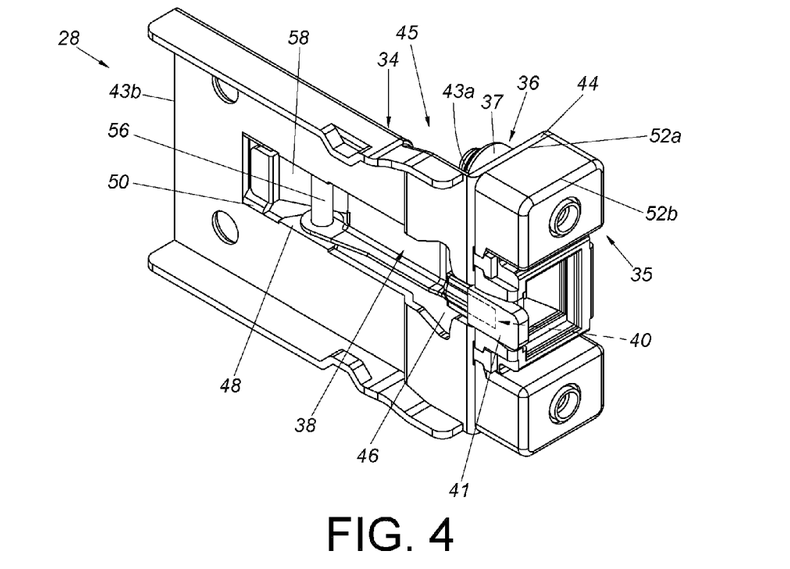
FIG. 4 is a diagram showing the bracket device of FIG. 2 in a second viewing angle.

As shown in FIG. 2, FIG. 3 and FIG. 4, the operating part 40 can be directly or indirectly connected to the locking part 39. In the present embodiment, the operating part 40 and the locking part 39 are integrally formed in one piece. Preferably, the bracket device 28 further comprises a sleeve 41 sleeved on the operating part 40.

Figure 5:
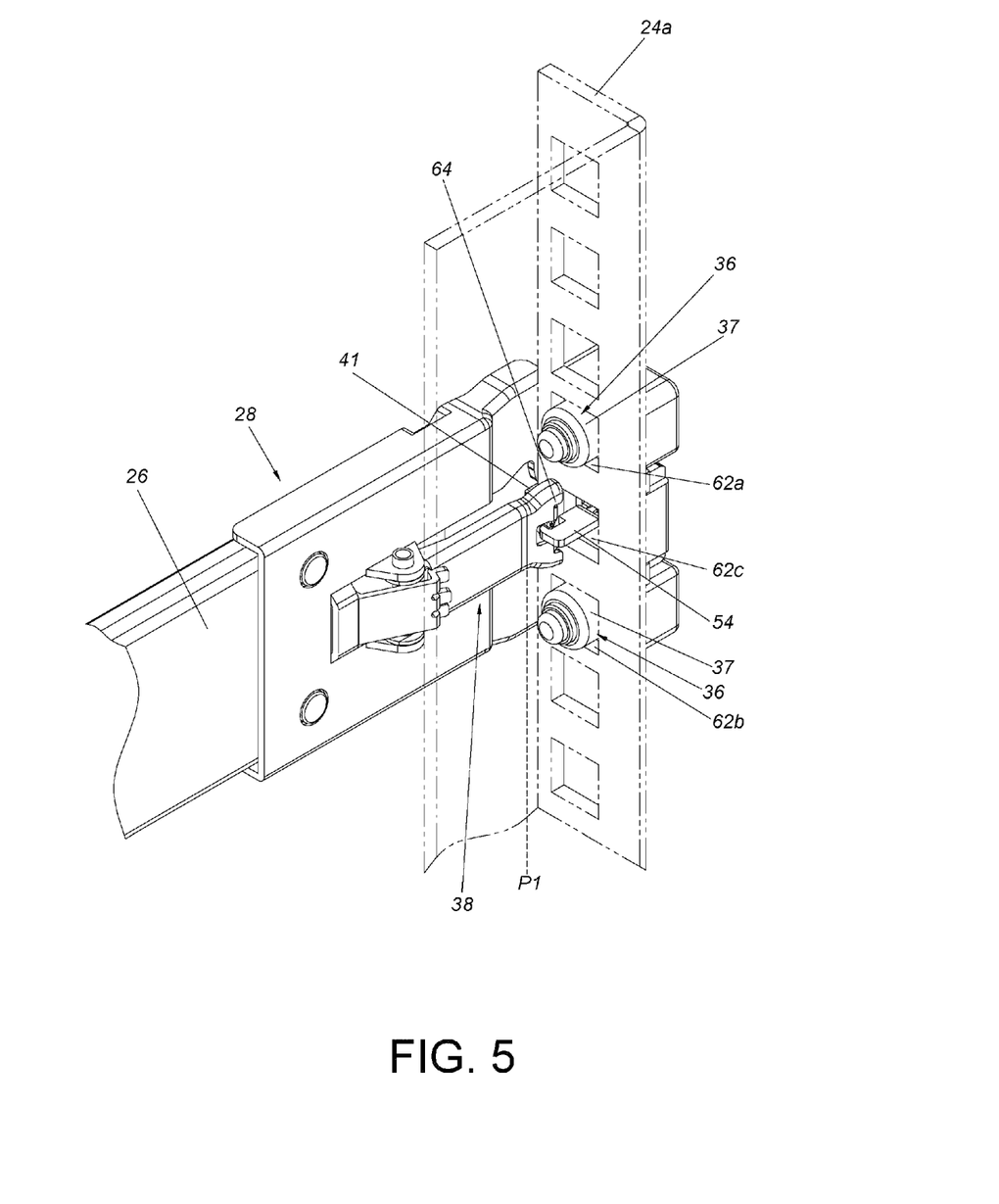
FIG. 5 is a diagram showing a slide rail mounted to a post of the rack through the bracket device according to an embodiment of the present invention.

As shown in FIG. 5, the bracket device 28 is attached to the first rail 26. For example, the bracket device 28 can be attached to the first rail 26 by riveting, screwing, welding or engaging. The first rail 26 can be mounted to the first post 24a through the bracket device 28. Specifically, the first post 24a has a plurality of holes. In the present embodiment, the first post 24a has a first hole 62a, a second hole 62b and a third hole 62c. Wherein, the two mounting members 36 are configured to penetrate through the first hole 62a and the second hole 62b of the first post 24a respectively, and the engaging feature 54 is configured to penetrate through the third hole 62c. On the other hand, when the locking member 38 is located at the first position P1 (or the locking position), a stopping part 64 of the locking member 38 faces toward the first post 24a in order to lock the first post 24a. According to such arrangement, the bracket device 28 can be mounted and locked to the first post 24a.

Figure 6:
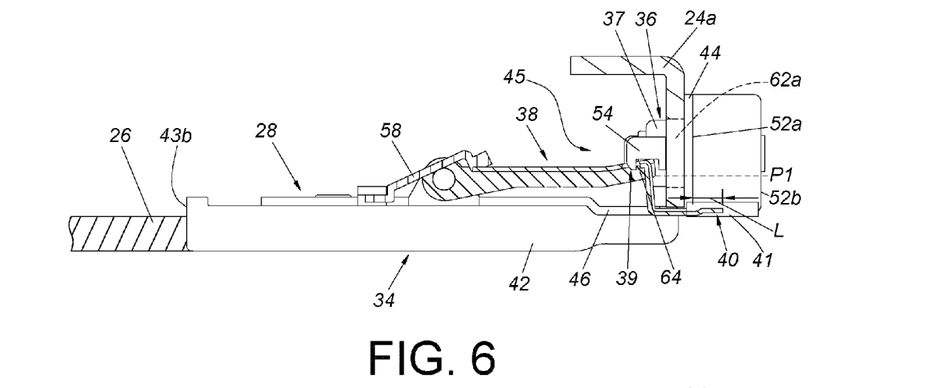
FIG. 6 is a diagram showing the slide rail mounted to the post of the rack through the bracket device according to an embodiment of the present invention, wherein a locking member of the bracket device is located at a first position.

As shown in FIG. 6, the locking member 38 corresponds to the opening 46. A front end of the operating part 40 is away from the rear part 52a of the base 35 by a distance L. In the present embodiment, the front end of the operating part 40 is extended the distance L toward a front part 52b of the base 35 to be in front of the first post 24a. For example, the front end of the operating part 40 is located adjacent to the base 35 and between the rear part 52a and the front part 52b of the base 35.

When each of the mounting members 36 and the engaging feature 54 penetrates through the corresponding hole 62a, 62b and 62c (only the hole 62a is shown in FIG. 6) of the first post 24a to be in rear of the first post 24a, and the locking member 38 is held at the first position P1 (or the locking position) in response to the elastic force provided by the elastic member 58, the stopping part 64 of the locking member 38 faces toward the first post 24a or the end plate 44 of the bracket 34 in order to lock the first post 24a. Moreover, when the locking member 38 is located at the first position P1 (or the locking position), the engaging feature 54 is configured to abut against or engage with the locking part 39.

Figure 7:
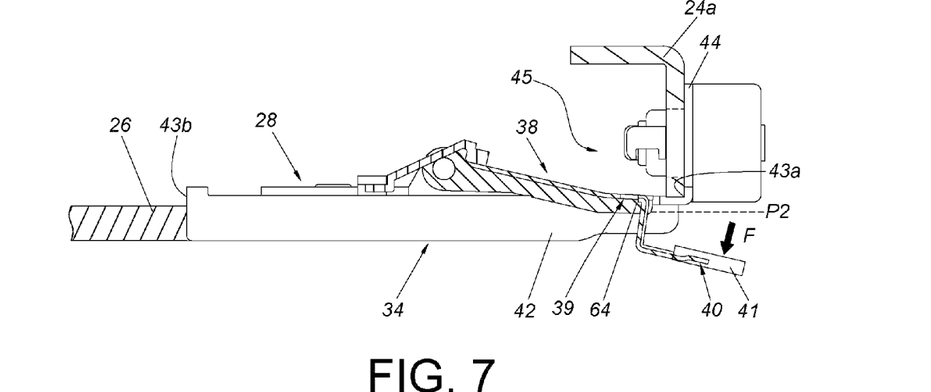
FIG. 7 is a diagram showing the locking member of the bracket device of FIG. 6 located at a second position in response to operation of an operating part.

As shown in FIG. 7, when a user stands in front of the first post 24a (also refer to FIG. 1, the user can stand in front of the first post 24a or the carried objects 32), the user can conveniently operate, such as applying a force F to the operating part 40 or the sleeve 41, in order to move the locking member 38 from the first position P1 to a second position P2 (such as a unlocking position) relative to the side plate 42 of the bracket 34. In other words, the operating part 40 of the locking member 38 is not located in the space 45 of the bracket 34. Wherein, when the locking member 38 is located at the second position P2, the stopping part 64 of the locking member 38 does not face toward the first post 24a or the end plate 44 of the bracket 34. That is to say, the bracket device 28 is in a unlocking status relative to the first post 24a.

Figure 8:
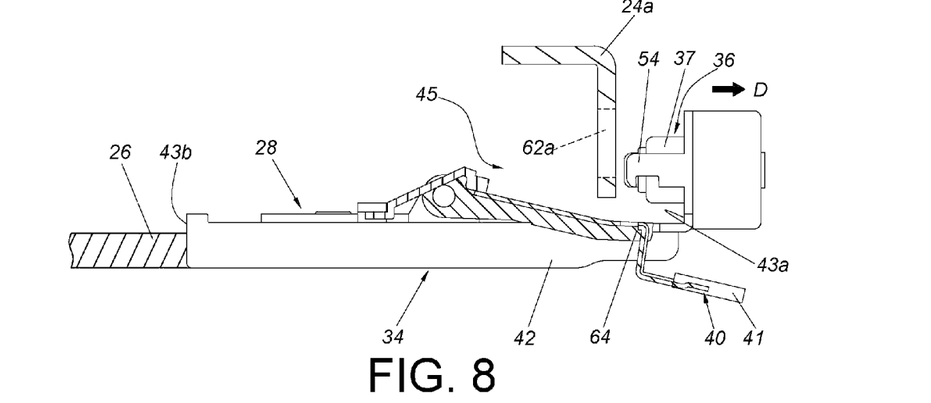
FIG. 8 is a diagram showing the bracket device of FIG. 7 being detachable form the post.

As shown in FIG. 8, when the bracket device 28 is in the unlocking status, the user can apply a force along a direction D to move the mounting members 36 and the engaging feature 54 away from the corresponding holes 62a, 62b, 62c (only the hole 62a is shown in FIG. 8) of the first post 24a, in order to further detach the first rail 26 from the first post 24a.

Figure 9:
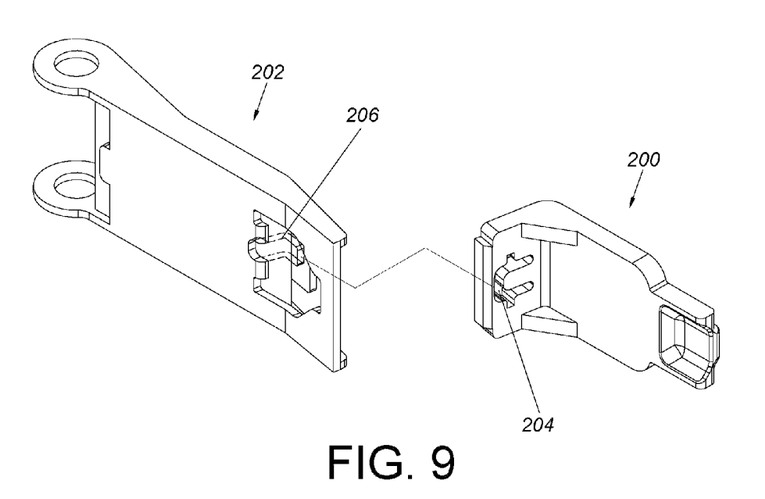
FIG. 9 is an exploded view of an operating part and a locking member according to an embodiment of the present invention.
Figure 10:
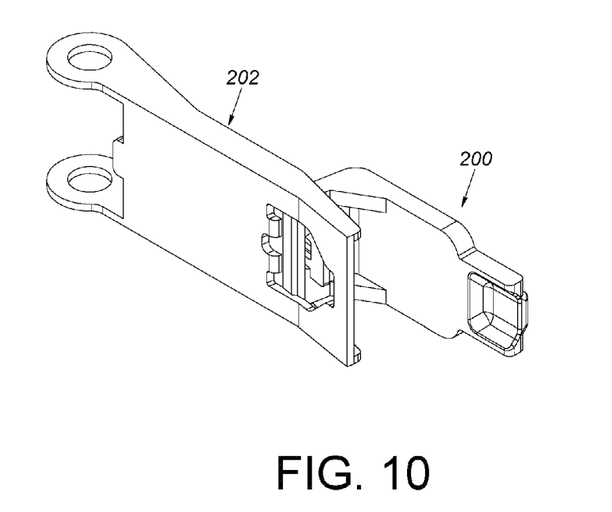
FIG. 10 is a diagram showing assembly of the operating part and the locking member of FIG. 9.

FIG. 9 and FIG. 10 are diagrams showing arrangement of an operating part 200 and a locking member 202 according to another embodiment of the present invention. Wherein, the operating part 200 and the locking member 202 are not integrally formed in one piece. Specifically, the operating part 200 and the locking member 202 are connected to each other by corresponding structures, such as a first structure 204 and a second structure 206. Wherein, the first structure 204 and the second structure 206 can be a combination of protruded and recessed structures or a combination of a hook and a hole (slot). Or, the operating part 200 and the locking member 202 can be connected to each other by welding, screwing or adhering.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A bracket device configured to mount a slide rail to a post, the bracket device comprising:
   a bracket comprising a first end part and a second end part, a space being defined between the first end part and the second end part;
   a mounting member arranged adjacent to the first end part of the bracket, the mounting member having a mounting part located in the space of the bracket; and
   a locking member arranged on the bracket, and comprising a locking part and an operating part, wherein the locking part of the locking member is held to be located at a locking position in the space of the bracket, the operating part, with an end being extended to be in front of the post, is arranged beside an edge of the post and the operating part and the locking part are connected to be movable with each other, such that the locking part is able to be moved away from the locking position with the operating part along the same direction in response to operation of the operating part of locking member;
   wherein the operating part of the locking member is not located in the space of the bracket.
2. The bracket device of claim 1, wherein the bracket comprises a side plate and an end plate bent relative to the side plate, the mounting member penetrates through the end plate.
3. The bracket device of claim 2, wherein the locking member is movably mounted to the side plate of the bracket, a stopping part of the locking member faces toward the end plate of the bracket when the locking member is located at the locking position, the stopping part of the locking member does not face toward the end plate of the bracket when the locking member is away from the locking position.
4. The bracket device of claim 1, further comprising an elastic member, wherein the locking member is held at the locking position in response to an elastic force provided by the elastic member.
5. The bracket device of claim 1, wherein the bracket comprises an engaging feature, when the locking member is located at the locking position, the locking part is configured to abut against the engaging feature.

6. The bracket device of claim 5, wherein one of the engaging feature and the locking part is a hook.

7. A bracket device for a slide rail, comprising:
a bracket;
a base attached to the bracket, the base comprising a rear part and a front part;
a mounting member adjacent to the rear part of the base; and
a locking member comprising an operating part configured to be operated to move the locking member from a first position to a second position, wherein a portion of the operating part is located adjacent to the base and between the rear part and the front part of the base, the locking member is configured to lock the bracket device to a post when the locking member is located at the first position, the operating part, with an end being extended to be in front of the post, is arranged beside an edge of the post and the operating part and the locking member are connected to be movable with each other, such that the locking member is able to be moved away from the first position with the operating part along the same direction in response to operation of the operating part of locking member.

8. The bracket device of claim 7, wherein the bracket comprises a side plate and an end plate bent relative to the side plate, the mounting member penetrates through the end plate.

9. The bracket device of claim 8, wherein the locking member is movably mounted to the side plate of the bracket, a stopping part of the locking member faces toward the end plate of the bracket when the locking member is located at the first position, the stopping part of the locking member does not face toward the end plate of the bracket when the locking member is away from the first position.

10. The bracket device of claim 7, wherein the locking member and the operating part are integrally formed in one piece.

11. The bracket device of claim 7, wherein the locking member and the operating part are not integrally formed in one piece.

12. The bracket device of claim 7, further comprising an elastic member, wherein the locking member is held at the first position in response to an elastic force provided by the elastic member.

13. The bracket device of claim 7, wherein the bracket comprises an engaging feature, the locking member further comprises a locking part, when the locking member is located at the first position, the locking part is configured to abut against the engaging feature.

14. The bracket device of claim 13, wherein one of the engaging feature and the locking part is a hook.

15. A bracket device configured to mount a slide rail to a post, the post having a hole, the bracket device comprising:
a bracket;
a base attached to the bracket, the base comprising a rear part and a front part;
a mounting member adjacent to the rear part of the base, the mounting member configured to penetrate through the hole of the post to be in rear of the post; and
a locking member comprising an operating part and a stopping part, the operating part configured to be operated to move the locking member relative to the bracket from a first position to a second position, wherein the stopping part of the locking member faces toward the post when the locking member is located at the first position, the stopping part of the locking member does not face toward the post when the locking member is located at the second position;
wherein a front end of the operating part is away from the rear part of the base to be in front of the post, the operating part, with an end being extended to be in front of the post, is arranged beside an edge of the post and the operating part and the locking member are connected to be movable with each other, such that the locking member is able to be moved away from the first position with the operating part along the same direction in response to operation of the operating part of locking member.

16. The bracket device of claim 15, wherein the bracket comprises a side plate and an end plate bent relative to the side plate, the mounting member penetrates through the end plate.

17. The bracket device of claim 15, further comprising an elastic member, the locking member is held at the first position in response to an elastic force provided by the elastic member.

18. The bracket device of claim 15, wherein the locking member further comprises a locking part, the bracket comprises an engaging feature, when the locking member is located at the first position, the locking part is configured to abut against the engaging feature.

19. The bracket device of claim 16, wherein the locking member is movably mounted to the side plate of the bracket.

20. The bracket device of claim 18, wherein one of the engaging feature and the locking part is a hook.

* * * * *